(12) United States Patent
Arthur et al.

(10) Patent No.: US 11,069,772 B2
(45) Date of Patent: Jul. 20, 2021

(54) TECHNIQUES FOR FABRICATING PLANAR CHARGE BALANCED (CB) METAL-OXIDE-SEMICONDUCTOR FIELD-EFFECT TRANSISTOR (MOSFET) DEVICES

(71) Applicant: General Electric Company, Schenectady, NY (US)

(72) Inventors: Stephen Daley Arthur, Glenville, NY (US); Reza Ghandi, Niskayuna, NY (US); Alexander Viktorovich Bolotnikov, Niskayuna, NY (US); David Alan Lilienfeld, Niskayuna, NY (US); Peter Almern Losee, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 16/221,034

(22) Filed: Dec. 14, 2018

(65) Prior Publication Data

US 2020/0194546 A1 Jun. 18, 2020

(51) Int. Cl.
*H01L 29/06* (2006.01)
*H01L 29/78* (2006.01)
*H01L 29/417* (2006.01)
*H01L 29/423* (2006.01)

(52) U.S. Cl.
CPC ...... *H01L 29/0634* (2013.01); *H01L 29/0623* (2013.01); *H01L 29/0692* (2013.01); *H01L 29/41766* (2013.01); *H01L 29/42376* (2013.01); *H01L 29/7832* (2013.01)

(58) Field of Classification Search
CPC .............................. H01L 29/78; H01L 29/417
See application file for complete search history.

(56) References Cited

U.S. PATENT DOCUMENTS

| | | | |
|---|---|---|---|
| 6,979,865 B2 | 12/2005 | Peake et al. |
| 8,110,869 B2 | 2/2012 | Bhalla |
| 8,673,700 B2 | 3/2014 | Yedinak et al. |
| 8,921,927 B2 | 12/2014 | Eguchi et al. |
| 9,136,381 B1 | 9/2015 | Kocon et al. |
| 9,947,779 B2 | 4/2018 | Zeng et al. |
| 2007/0045727 A1 | 3/2007 | Shiraishi et al. |
| 2009/0166722 A1 | 7/2009 | Hebert |

(Continued)

OTHER PUBLICATIONS

Padmanabhan, Karthik, et al.; "Self terminating lateral-vertical hybrid super-junction FET that breaks RDS.A—Charge balance trade-off window", 2018 IEEE 30th International Symposium on Power Semiconductor Devices and ICs (ISPSD), pp. 152-155, Chicago, IL, USA, May 2018.

(Continued)

*Primary Examiner* — Kenneth Parker
*Assistant Examiner* — Long H Le
(74) *Attorney, Agent, or Firm* — Fletcher Yoder, P.C.

(57) ABSTRACT

Aspects of the present disclosure are directed toward designs and methods of manufacturing semiconductor devices, such as semiconductor charge balanced (CB) devices or semiconductor super-junction (SJ) devices. The disclosed designs and methods are useful in the manufacture of CB devices, such as planar CB metal-oxide semiconductor field-effect transistor (MOSFET) devices, as well as other devices.

14 Claims, 10 Drawing Sheets

(56) References Cited

U.S. PATENT DOCUMENTS

| | | | |
|---|---|---|---|
| 2010/0317158 A1* | 12/2010 | Yilmaz | H01L 29/1095 |
| | | | 438/138 |
| 2016/0035904 A1 | 2/2016 | Hisada et al. | |
| 2016/0087034 A1 | 3/2016 | You et al. | |
| 2017/0278924 A1* | 9/2017 | Bolotnikov | H01L 29/73 |
| 2018/0019309 A1 | 1/2018 | Radhakrishnan et al. | |
| 2018/0269311 A1 | 9/2018 | Liu et al. | |
| 2020/0020796 A1* | 1/2020 | Hoshi | H01L 29/1608 |
| 2020/0083365 A1* | 3/2020 | Konstantinov | H01L 21/046 |
| 2020/0203524 A1* | 6/2020 | Liu | H01L 29/7806 |

OTHER PUBLICATIONS

Baliga, B.J.; Power Semiconductor Devices; PWS Publishing Co; 1st edition; May 2, 1995, pp. 415-417.

Baliga, B.J.; Advanced Power MOSFET Concepts; Springer Science + Business Media; Jul. 7, 2010; pp. 478-479 & 504-505.

Baliga, B.J.; Silicon Carbide Power Devices; 2005; World Scientific Publishing Co. Pte. Ltd.; Singapore; pp. 259-261.

U.S. Appl. No. 16/147,210, filed Sep. 28, 2018, Stephen Daley Arthur.

U.S. Appl. No. 15/953,037, filed Apr. 13, 2018, Alexander Viktorovich Bolotnikov.

International Search Report and Written Opinion for PCT/US2019/065770 dated Apr. 8, 2020, 9 pages.

* cited by examiner

TECHNIQUES FOR FABRICATING PLANAR CHARGE BALANCED (CB) METAL-OXIDE-SEMICONDUCTOR FIELD-EFFECT TRANSISTOR (MOSFET) DEVICES

TECHNICAL FIELD

The subject matter disclosed herein relates to semiconductor power devices and, more specifically, to systems for providing charge balanced (CB) semiconductor power devices.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

For semiconductor power devices, charge balanced (CB) designs offer several advantages. For example, CB devices demonstrate reduced resistance and reduced conduction losses per unit area relative to traditional unipolar device designs. However, the switching speed of CB devices utilizing floating CB regions depends on the recombination-generation rates of the carriers in the semiconductor material. For some semiconductor materials, such as wide band gap materials, the recombination-generation rates may be relatively low and may cause relatively low switching speeds. Inclusion of floating CB regions may improve switching speeds even in these semiconductor materials, however, a floating CB region may be unpredictable. For example, it may be difficult to determine or measure a potential (e.g., voltage level) associated with a floating CB region, which can result in irregularity and/or unpredictability during device operation.

BRIEF DESCRIPTION

Certain embodiments commensurate in scope with the originally claimed disclosure are summarized below. These embodiments are not intended to limit the scope of the claimed disclosure, but rather these embodiments are intended only to provide a brief summary of possible forms of the disclosure. Indeed, embodiments may encompass a variety of forms that may be similar to or different from the embodiments set forth below.

In one embodiment, a charge balanced (CB) planar metal-oxide-semiconductor (MOS) device may include a charge balanced (CB) layer defined within a first epitaxial (epi) layer and having a first conductivity type. The CB layer includes charge balanced (CB) regions of a second conductivity type. The CB planar MOS device may also include a device layer defined in a second epi layer disposed on the CB layer. The second epi layer has the first conductivity type. The device layer may include non-linear device cells that each include a first base region of the second conductivity type disposed at an upper surface of the second epi layer and a source region of the first conductivity type disposed at the upper surface of the second epi layer adjacent to the first base region. The device layer may also include a channel region of the second conductivity type or a second base region of the first conductivity type disposed in the second epi layer adjacent to the source region. The device layer may also include a junction field-effect transistor (JFET) region of the first conductivity type disposed at the upper surface of the second epi layer adjacent to the channel region or the second base region. The CB planar MOS device may also include a charge balanced (CB) bus region of the second conductivity type and electrically couples at least one of the CB regions of the CB layer and a region of at least one non-linear device cells of the second conductivity type.

In another embodiment, a method of manufacturing a planar charge balance (CB) metal-oxide-semiconductor (MOS) device includes forming a charge balance (CB) layer from a first epitaxial (epi) layer of a first conductivity type by implanting charge balance (CB) regions of a second conductivity type within the first epi layer. The method also includes forming a device layer from a second epi layer disposed on the CB layer, where the device layer includes a base region of the first conductivity type disposed in the second epi layer or a channel region of a second conductivity type. The device layer also includes a junction field-effect transistor (JFET) region of the first conductivity type disposed at an upper surface of the second epi layer adjacent to the channel region or the base region. The CB planar MOS device is separated from an adjacent CB planar MOS device by at least a portion of the JFET region. The method also includes performing an implantation to form a charge balanced (CB) bus region of the second conductivity type having a depth to extend into portions of the device and CB layer, wherein the CB bus region electrically couples the CB regions to a region of the device layer of the second conductivity type.

In yet another embodiment, a system includes a first planar charge balanced (CB) metal-oxide-semiconductor (MOS) device and a second CB planar MOS device. The first CB planar MOS device and the second CB planar MOS device each respectively include a first epitaxial (epi) layer, a junction field-effect transistor (JFET) region, a charge balanced (CB) layer, a source contact, and a device layer. The first epi layer includes one of a base region of a first conductivity type or a channel region that of a second conductivity type. The JFET region is of the first conductivity type and is disposed at an upper surface of the first epi layer adjacent to the channel region or the base region. The CB layer is defined within a second epitaxial (epi) layer that has the first conductivity type. The CB layer includes charge balanced (CB) regions of the second conductivity type. The source contact is disposed on a device layer defined in the first epi layer. The first epi layer is disposed on the CB layer. The system also includes an active area having the first CB planar MOS device and the second CB planar MOS device and an overhead area that of the second conductivity type disposed adjacent to the active area. The system also includes a charge balanced (CB) bus region of the second conductivity type that extends between the first epi layer and the second epi layer and electrically couples the CB regions of the CB layer to the source contact via a region of the device layer of the second conductivity type. The CB bus region is disposed within the active area and/or the overhead area and at least a portion of the JFET region separates the first CB planar MOS device from the second CB planar MOS device such that the first CB planar MOS device from the second CB planar MOS device align within a cellular device structure.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
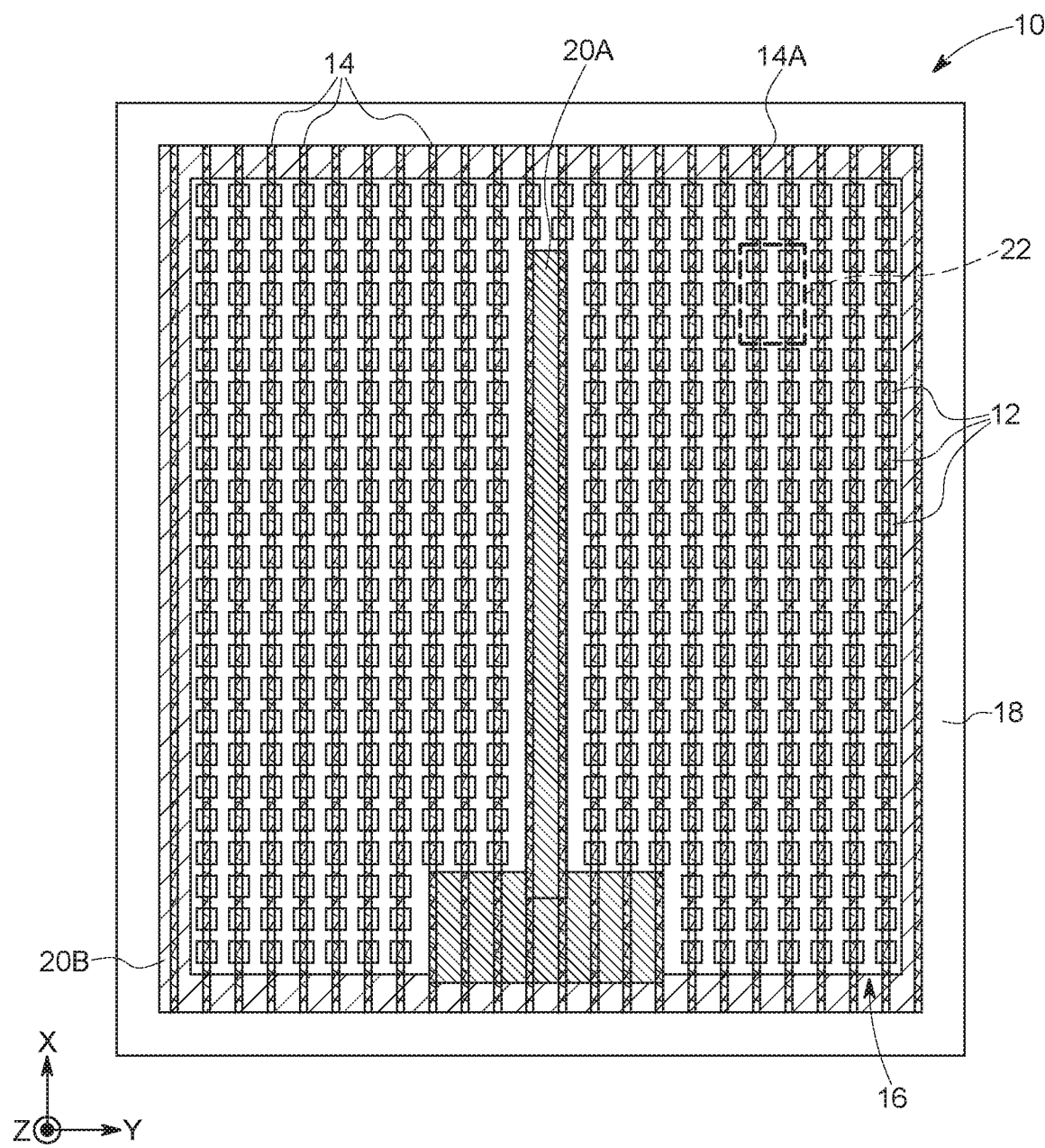
FIG. 1 is a plan view of a semiconductor device array that includes multiple planar charge balanced (CB) metal-oxide semiconductor field-effect transistor (MOSFET) devices each having a cellular structure, in accordance with embodiments of the present approach.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. Accordingly, the term "disposed directly on" as used herein means that the two layers or features are directly in contact with each other with no intervening layers or features there between. The term "adjacent" as used herein means that the two layers are disposed contiguously and are in direct contact with each other.

In the present disclosure, when a layer/region is described as "on" another layer or substrate, it is to be understood that the layers/regions may either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively the farthest from the substrate layer. Furthermore, the use of "vertical" refers to a direction perpendicular to one or more layers or in a normal direction relative to the layer disposition.

Present embodiments are directed toward designs and methods of manufacturing semiconductor devices, such as semiconductor charge balanced (CB) devices or semiconductor super-junction (SJ) devices. The disclosed designs and methods are useful in the manufacture of CB devices, such as planar CB metal-oxide semiconductor field-effect transistor (MOSFET) devices, as well as other devices that may be useful for medium-voltage (e.g., 2 kV-10 kV) and high-voltage (e.g., greater than or equal to 10 kV or 10 kV-20 kV) power conversion related applications. While discussed below in the context of implanting silicon carbide (SiC) layer, the disclosed methods may be useful when performing high-energy implantation processes on materials, such as gallium nitride, diamond, aluminum nitride, boron nitride, or other suitable wide-bandgap semiconductor materials.

As discussed below, the disclosed CB devices include multi-layered drift regions implemented using repeated epitaxial growth and dopant ion implantation steps. As used herein, the term "multi-layered," as well as references to a particular number of layers (e.g., "two-layered," "three-layered," "four-layered,"), may refer to the number of epitaxial (epi) layers of the CB device. The disclosed multi-layered drift region designs include charge balanced (CB) layers having a first conductivity type (e.g., n-type CB layers). Further, each of these CB layers includes a plurality of charge balanced (CB) regions, which are discrete, buried, implanted regions of doping having the opposite conductivity type as the remainder of the CB layer and that reshape the electrical field in the active area of a CB device. These CB regions are described herein as "buried" in that they are disposed within the lower epi layers (e.g., within a CB layer that is disposed between the upper/device epi layer and the substrate layer) of the CB device. For the disclosed CB device embodiments, as discussed below, these CB layer designs enable low conduction losses and high blocking voltages while still maintaining a relatively simple fabrication process.

Further, as discussed below, the disclosed CB devices include CB bus regions of the same conductivity type as the CB regions, and the CB bus regions generally provide an electrical connection (e.g., a vertical connection) between the CB regions of the CB layers and a doped region (e.g., a top region, a second conductivity region, a well region, body contact region, a body region, or termination region) of the same conductivity type as the CB regions that is disposed at or proximate to an upper surface (e.g., the epi layer furthest from the substrate layer) of the device. It is presently recognized that fast switching speeds and high blocking voltages may be achieved using CB bus regions having a sufficient depth to reach and contact the CB regions. As such, when the CB device transitions from an off-state to on-state, carriers are able to flow directly from the doped region(s) to the CB regions via CB bus regions. Conversely, during a transition from on-state to off-state, carriers are able to flow directly from the CB regions to the source/body terminal via the CB bus regions. As a result, the switching performance of disclosed CB devices is independent of the recombination-generation rates of the carriers, thereby offering increased switching speeds and reduced switching and dynamic on-resistance losses compared to CB devices with floating CB regions having the same current/voltage rating, without substantially increasing the leakage current.

FIG. 1 is a plan view or top-down view of an array 10 (e.g., a semiconductor device array) of multiple CB planar MOSFET devices (e.g., CB planar MOSFET device 12) including multiple areas where gates are formed and buried CB regions 14 (e.g., CB region 14A) that span the respective CB planar MOSFET devices. As depicted, the array 10 has a cellular structure with devices specifically formed to be non-linear devices. It may be appreciated that, to more clearly illustrate certain components of the CB planar MOSFET devices, as well as other devices discussed below, certain commonly understood design elements (e.g., top metallization, passivation, edge termination, and so forth) may be omitted. It should also be appreciated that the various layers and features illustrated in the figures of this disclosure are not drawn to scale but are instead drawn to convey the concepts and features being described and discussed.

Various additional components are illustrated that enable operation of the array 10 of CB planar MOSFET devices, including an active area 16, a high voltage termination area 18, overhead areas 20 (e.g., overhead area 20A, overhead area 20B). These additional components are coupled to various portions of the CB planar MOSFET devices to enable operation of the array 10 for power conversion applications. In certain embodiments, the buried CB regions 14 are electrically coupled to implanted regions (e.g., well regions, termination regions) having the second conductivity type that are disposed at the surface in overhead areas 20 and that are in ohmic contact with the source/body terminal. These connections may be formed through various embodiments of CB bus regions. For example, the overhead areas 20 may be designed to include one or more CB bus regions to connect the buried CB regions 14 to the source/body terminal of the system. As depicted, the buried CB regions 14 are orientated parallel, or substantially parallel to each other. As will be appreciated, the multiple CB planar MOSFET devices may be orientated and designed in a variety of suitable structures and feature a variety of suitable device features. To help explain, an area 22 of a portion of the array 10 is explained using FIG. 2 and FIG. 3 and an embodiment of the area 22 is depicted and explained using FIG. 4 and FIG. 5. In general, these figures depict square cells disposed in the array 10 following square coordinates.

Figure 2:
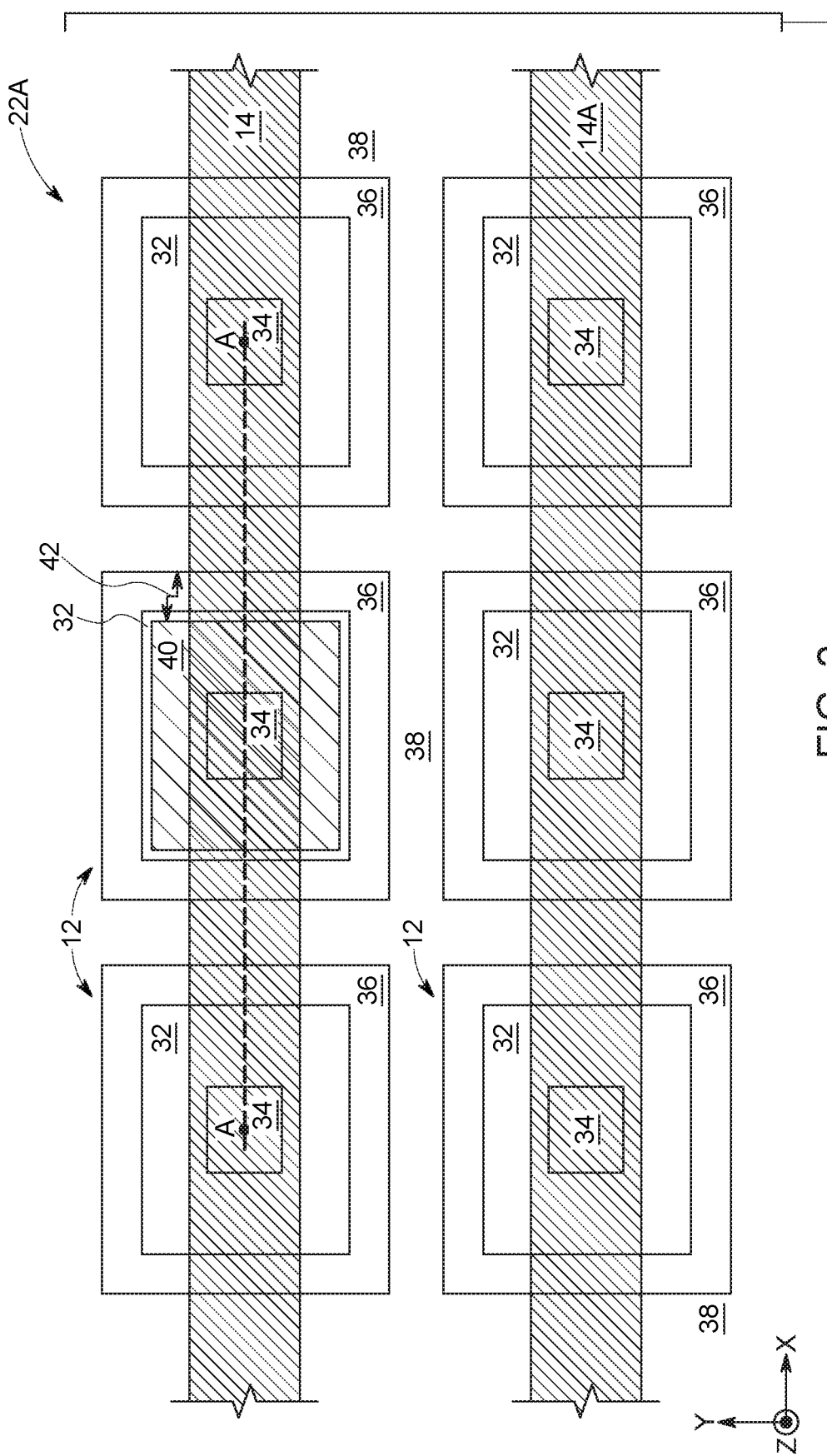
FIG. 2 is an additional plan view of the semiconductor device array of FIG. 1, in accordance with embodiments of the present approach.
Figure 3:
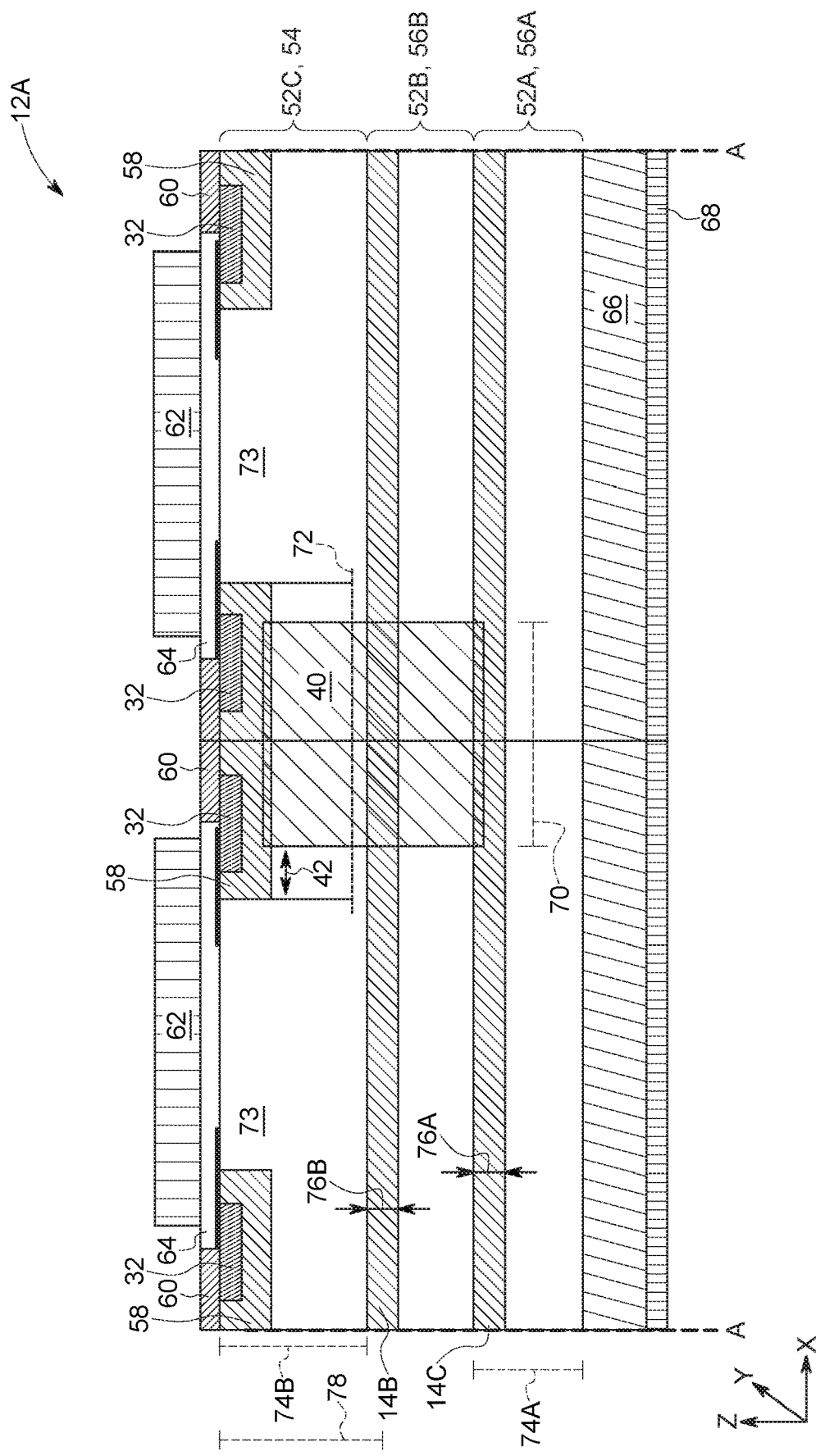
FIG. 3 is a cross-sectional view of a CB planar MOSFET device taken along line A-A of FIG. 2, in accordance with embodiments of the present approach.

FIG. 2 is an additional plan view of the semiconductor device array of FIG. 1. In particular, FIG. 2 depicts a close up view of an embodiment of the area 22 (e.g., area 22A) of the array 10. The area 22A depicts multiple (e.g., six) CB planar MOSFET devices having buried CB regions 14. The CB planar MOSFET devices also include a source region 32 having a first conductivity type (e.g., n-type or p-type), a base region 34 having a second conductivity type (e.g., opposite the first conductivity type, the epi doping of the epitaxial layers of the CB planar MOSFET device 12), and a channel region 36 having the second conductivity type. The base region 34 and the channel region 36 are formed at an upper surface of a well region while the CB planar MOSFET device 12 is in the active state. The array 10 also includes a junction field-effect transistor (JFET) region 38. When the CB planar MOSFET device 12 is in the active state, current flows through the JFET region 38 via the channel region 36. The source region 32 is disposed adjacent to the base region 34 and the channel region 36 and defined within the well region. The CB planar MOSFET device 12 also includes a CB bus region 40. Although the CB bus region 40 is depicted as being formed between the source region 32 and the base region 34, it should be understood that the base region 34 and the source region 32 are disposed on the CB bus region 40. In this way, the CB bus region 40 has the same conductivity type as the CB regions 14 and couples the well region to the CB regions 14. An area (e.g., dimensions) of the CB bus region 40 is to be defined smaller than a respective area of the channel region 36 and the well region, as will be appreciated. The difference in areas of the CB bus region 40 and the channel region 36 is depicted as a tolerance 42. FIG. 3 depicts more clearly the CB bus region 40, the source region 32, and the well region.

FIG. 3 is a cross-sectional view of a CB planar MOSFET device associated with the area 22A taken along line A-A of FIG. 2. It should be understood that although the depicted device includes a full cell and two half cells, for ease of description, the depicted structure is referred to as a CB planar MOSFET device. The CB planar MOSFET device 12A in FIG. 3 includes a number of epitaxial (epi) layers 52 (e.g., epi layer 52A, epi layer 52B, epi layer 52C) having a first conductivity type that form a device layer 54 and CB layers 56 (e.g., CB layer 56A, CB layer 56B) of the CB planar MOSFET device 12A. The CB bus region 40 may be implanted into each of the epi layers 52 (e.g., epi layer 52B, epi layer 52A) using high-energy ion implantation.

The device layer 54 of the illustrated CB planar MOSFET device 12A includes a well region 58 having the second conductivity type disposed adjacent to the source region 32 having the first conductivity type. A source contact 60 (e.g., a source electrode, source terminal) is disposed on the well region 58. A gate 62 (e.g., a polysilicon gate) is disposed on the well region 58 and the source region 32. The gate 62 is suitably electrically isolated from the device layer 54 by an oxide 64 (e.g., silicon diode, SiO2). Further, the CB planar MOSFET device 12A includes a substrate 66 (e.g., semiconductor substrate layer, a wide band gap substrate layer) and a drain contact 68 (e.g., drain electrode, drain terminal) is disposed on the bottom of the CB planar MOSFET device 12 directly on a lower surface of the substrate 66.

As depicted, the CB planar MOSFET device 12A is an inversion-mode planar MOSFET with the CB regions 14 (e.g., CB region 14B, CB region 14C) of the CB layers 56 (e.g., CB layer 56A, CB layer 56B) electrically coupled to the well region 58 and at least partially electrically coupled to each other through the CB bus region 40. Here, high-energy ion implantation techniques are used to implant a conductive path having the second conductivity type into the CB planar MOSFET device 12A to create the CB bus region 40. Thus, in this embodiment, a width 70 of the CB bus region 40 (e.g., along X-axis) is sufficient to accommodate any dimensional constraints of the high-energy ion implantation and narrow enough to be contained within a width 72 of the well region 58. This high-energy ion implantation facilitates the implanting of dopant ions at depths greater than 1 micrometers ($\mu$m).

In different embodiments, the CB regions 14 may have different cross-sectional shapes (e.g., defined by implantation energies/doses). For some embodiments, the shape of the CB regions 14 may not substantially vary along the Z-axis. In addition, one or more CB regions 14 and/or one or more CB bus regions 40 may be formed in the epi layers 52, such as along the Y-axis and/or the Z-axis. That is, for example, the CB planar MOSFET device 12A may include any suitable number of CB bus regions 40 or CB regions 14. Additionally, with respect to dimensions, aspects of the CB planar MOSFET devices 12, such as CB regions 14, well regions 58, CB bus regions 40, source regions 32, and the like, may respectively have a particular width (e.g., along the X-axis), depth or thickness (e.g., along the Z-axis), spacing (e.g., along the Y-axis), and length (e.g., along the Y-axis), and these respective dimensions may be suitably different between devices and/or layers based on application of the CB planar MOSFET devices 12.

Additionally, the epi layers 52 each have an epi dopant concentration which, in certain embodiments, may be the same or different. While the illustrated embodiment includes three epi layers 52, it should be understood that the CB planar MOSFET device 12A may include any suitable number of epi layers 52 (e.g., two, three, four, five, six, or more), including any suitable number of CB layers 56, to yield a CB planar MOSFET device 12A having a particular desired voltage rating. In some embodiments, the epi layers 52 may be formed from one or more wide band gap semiconductor materials, such as silicon carbide (SiC), gallium nitride, diamond, aluminum nitride, and/or boron nitride. Semiconductor devices implementing SiC epi layers 52 may have particular improvements, including improved thermal stability, lower on-state resistance (Rds(on)), higher breakdown voltages, and improved switching performance at least in comparison to semiconductor devices formed from other materials. Regardless of the material, epi layers 52 may be fabricated using repeated cycles of epitaxial overgrowth.

For example, to manufacture the embodiment of the CB planar MOSFET device 12A illustrated in FIG. 2 and FIG. 3, the epi layer 52A may be formed on the substrate 66 using epitaxial growth techniques, and the CB region 14C may be formed in the epi layer 52A using ion implantation to yield a first CB layer 56A. Further, an epi layer 52B may be formed directly on the epi layer 52A (e.g., along the Z-axis) using epitaxial growth techniques. It should be noted that the epitaxial growth/ion implantation steps may be repeated multiple (e.g., two, three, four, five, or more) times to yield a CB planar MOSFET device 12A with any suitable number of CB layers 56. For example, the epi layer 52C may be formed directly on the epi layer 52B (e.g., along the Z-axis) using epitaxial growth techniques. The epi layer 52C, as the top layer of the epi layers 52, may be suitably implanted with particular features to form the device layer 54 of the CB planar MOSFET device 12A. For example, the epi layer 52C may be implanted to form a channel region and a junction field-effect transistor (JFET) region disposed at an upper surface of first epi layer 52C adjacent to the channel region. The CB planar MOSFET device 12A may be formed adjacent to additional CB planar MOSFET devices to form a structure having a particular geometry (e.g., following hexagonal or rectangular coordinates). The CB planar MOSFET device 12A may be formed relative to adjacent devices such that at least a portion of the JFET region separates at least a portion of the CB planar MOSFET device 12A from an adjacent device. The JFET region separating the adjacent CB planar MOSFET devices 12 from each other is considered a drift region 73. It should be noted that in some embodiments, a region is formed near the surface of the drift region 73 to create an enhanced JFET region of the first conductivity. Thus, the enhanced JFET region may be disposed on the drift region 73 after formation. The enhanced JFET region and modified drift region 73 is depicted more clearly and discussed further in FIG. 6 and FIG. 8, but in general is formed to make the JFET region more conductive. In these embodiments, the drift region 73 is considered the region adjacent but separate from the enhanced JFET region.

Further, it should be appreciated that epi doping of the epi layers 52, doping concentrations of the CB regions 14, thicknesses 74 of the epi layers 52 (e.g., thickness 74A, thickness 74B), the lengths of the CB regions 14 (e.g., not depicted, length along Y-axis), depths 76 (e.g., depth 76A, depth 76B) of the CB regions 14, and/or spacings (e.g., not depicted, spacing along the Y-axis) between the CB regions 14 may be varied for different embodiments to enable desired electrical performance (e.g., desired blocking voltage) and particular CB layer (e.g., CB layer 56A) characteristics of the CB planar MOSFET device 12A.

The CB bus regions (e.g., CB bus region 40) may be fabricated by introducing dopant ions (e.g., boron, aluminum, nitrogen, phosphorus) into the epi layers 52 of the CB planar MOSFET device 12A using high-energy ion implantation. A single CB bus region (e.g., CB bus region 40) may include a single implanted region or multiple implanted regions substantially aligned with one another across successive epi layers 52. In some embodiments, dopant ions may be implanted with implant acceleration energies of approximately 500 kiloelectron volts (KeV) to achieve a desired implantation depth 78. In the example of FIG. 3, the CB bus region 40 of the CB planar MOSFET device 12A electrically couples the well region 58 to the CB region 14. Additionally, in certain embodiments, CB bus regions may be formed using high-energy ion implantation along with a suitable high energy mask (e.g., silicon on insulator (SOI), polysilicon, thick silicon oxide, high-Z metals such as platinum, molybdenum, gold). In particular, the high energy mask may be placed (e.g., formed, grown, deposited) directly on an epi layer (e.g., top epi layer 52C) after epitaxial growth. The high-energy implantation mask may then mask a first portion of the upper surface of the device layer 54 and may selectively expose a second portion of the upper surface. Accordingly, the CB bus regions may be implanted into the exposed portion of the upper surface of the device layer 54. Further, in some embodiments, the CB bus regions may be at least partially implanted between the epi growth steps (e.g., implanted before or after the CB region 14B is formed in the epi layer 52B and before the epi growth of the next epi layer 52C) such that a lower energy implant may be used to achieve a suitable depth.

As noted above, the CB bus region 40 decreases switching losses and increases switching speed by electrically coupling the CB regions 14 to the well region 58. In particular, carriers from the source contact 60 and the well region 58 may flow directly to the CB regions 14 via the CB bus region 40 during transition of the CB planar MOSFET device 12A from an off-state (e.g., blocking state) to an on-state (e.g., active state, conducting state), and similarly, carriers from the CB regions 14 may flow directly to the source contact 60 and the well region 58 via the CB bus region 40 during transition of the CB planar MOSFET device 12A from the on-state to the off-state.

During on-state operation, a suitable gate voltage (e.g., at or above a threshold voltage (Vth) of the CB planar MOSFET device 12A) permits current to flow from the drain contact 68 to the source contact 60. As described earlier, the CB planar MOSFET device 12A includes two CB layers 56 (e.g., CB layer 56A, CB layer 56B) that each include CB regions 14 (e.g., CB region 14B, CB region 14C). These CB regions 14 are oppositely doped relative to the remainder of the CB layers 56 (e.g., relative the epi doping of the CB layer 56). For example, when the CB planar MOSFET device 12A has n-type epi layers 52 and the CB regions 14 are p-type, and for CB planar MOSFET devices having p-type epi layers 52 the corresponding CB regions 14 are n-type. Further, the dopant ion concentrations in the different CB layers 56 may be the same or different. It should be appreciated that the CB regions 14 are electrically coupled to each other and the well region 58 through CB bus region 40. These CB regions 14 and the remaining portion of the CB layers 56 are each generally designed to substantially deplete to generally provide similar amounts (e.g., substantially equal amounts) of effective charge (e.g., per $cm^2$, normalized to device active area) from dopant ions under reverse bias. The illustrated charge balanced structure permits the CB planar MOSFET device 12A to achieve high breakdown voltage and low on-state resistance, since the p-type semiconductor portions and the n-type semiconductor portions are both substantially depleted under nominal blocking conditions. It should be noted that CB bus region 40 is merely an example, and, in some embodiments, the CB bus region 40 may be disposed at a same or different position than depicted in FIG. 3 or FIG. 4. In other words, the CB bus region 40 may take a variety of shapes and sizes to ensure that the various CB regions 14 are electrically coupled via the CB bus region 40 to the well region 58 of the CB planar MOSFET device 12A.

As described above, the area (e.g., dimensions) of the CB bus region 40 is to be defined smaller than the channel region 36 and the well region 58. In this way, an ohmic connection (e.g., ohmic contact) is able to be made through the source contact 60 onto the CB bus regions (e.g., CB bus region 40) to access the CB regions 14. Since the width 70 of the CB bus region 40 is contained within the width 72 of the well region 58 (e.g., thus, tolerance 42 is a value greater than or equal to zero), the ohmic connection is able to be made without blocking any of the electrons flowing through an electronic conduction path vertically (e.g., –Z direction relative to the Z-axis) into the device. As depicted in FIG. 2 and FIG. 3, the CB bus region 40 is formed within the active area 16 of the array 10. As noted above, it should be understood that the CB bus region 40 may be additionally or alternatively formed within the overhead areas 20 of the array 10.

Figure 4:
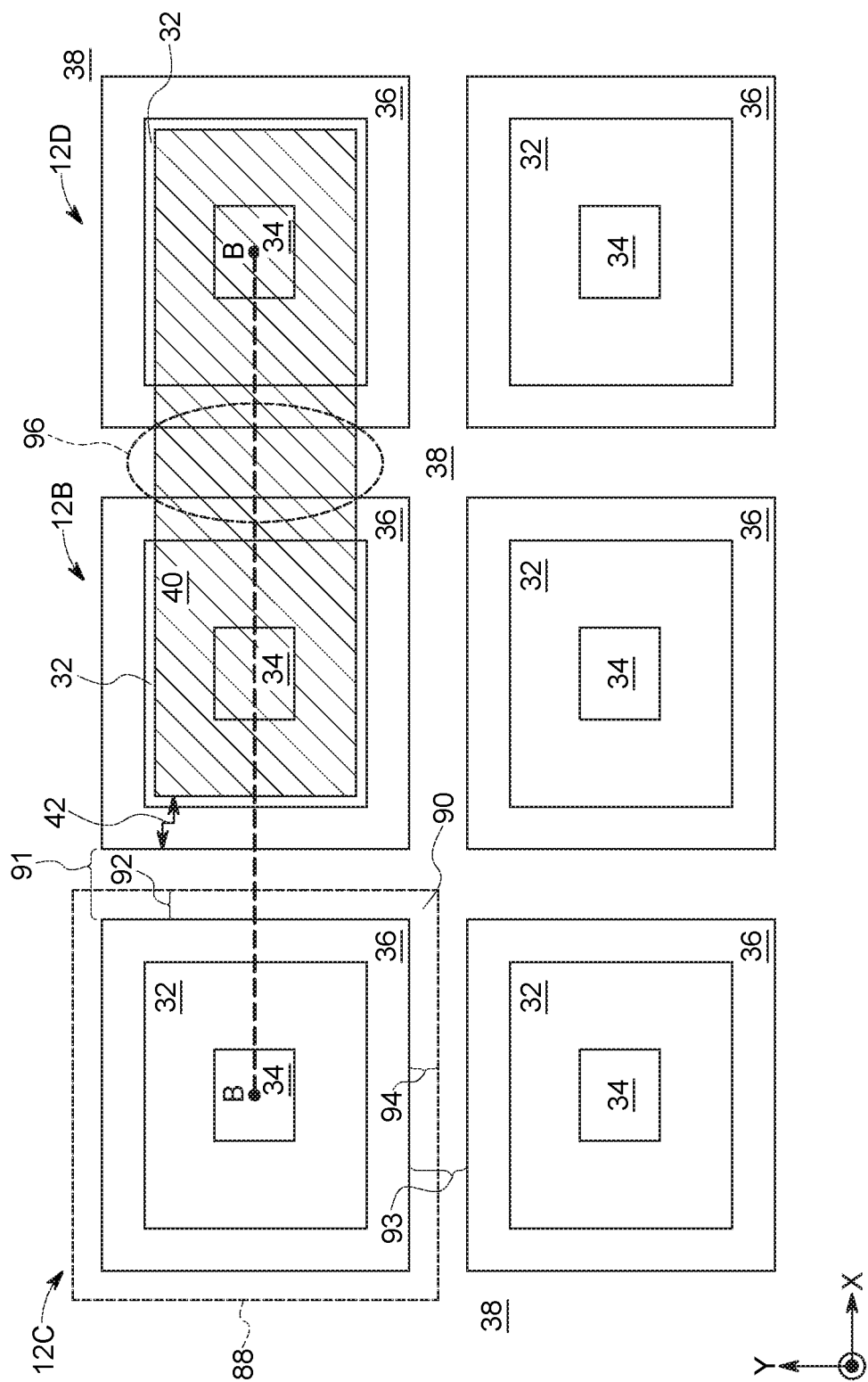
FIG. 4 is an additional plan view of another embodiment of the semi-conductor device array of FIG. 1, in accordance with embodiments of the present approach.

FIG. 4 is a plan view that depicts another embodiment of the CB planar MOSFET device 12, CB planar MOSFET device 12B, including the CB bus region 40 aligned across one or more CB planar MOSFET devices 12. The CB bus region 40 connects to CB regions 14, as described above, although not specifically depicted. In some embodiments, such as for relatively small cells, defining the CB bus region 40 for an individual cell is not practical. It is noted that an example of the individual cell corresponding to a respective CB planar MOSFET device (e.g., CB planar MOSFET device 12C) of the multiple CB planar MOSFET devices 12 is indicated by outline 88. The outline 88 includes the base region 34, the channel region 36, the source region 32, and a portion 90 (e.g., corresponding to half a width 91 or a width 92, and corresponding to half a length 93 or a length 94) of the JFET region 38. It should be noted that this outline 88 generally applies to each of the plan views described in this disclosure, such that a cellular structure associated with a CB planar MOSFET device 12C includes the base region 34, the channel region 36, the source region 32, and the portion 90 of the JFET region 38. In these embodiments, the CB bus region 40 is defined across multiple CB planar MOSFET devices 12, as is illustrated. Two or more cells may be connected through the CB bus region 40. As will be appreciated, when connecting two or more cells through the CB bus region 40, the channel region 36 disposed on the surface of the well region 58 is lost. This is because the CB bus region 40 is formed across a portion (e.g., portion 96) of the JFET region 38 between the two or more cells. For example, the CB bus region 40 is formed across the portion 96 of the JFET region between the CB planar MOSFET device 12B and a CB planar MOSFET device 12D.

Figure 5:
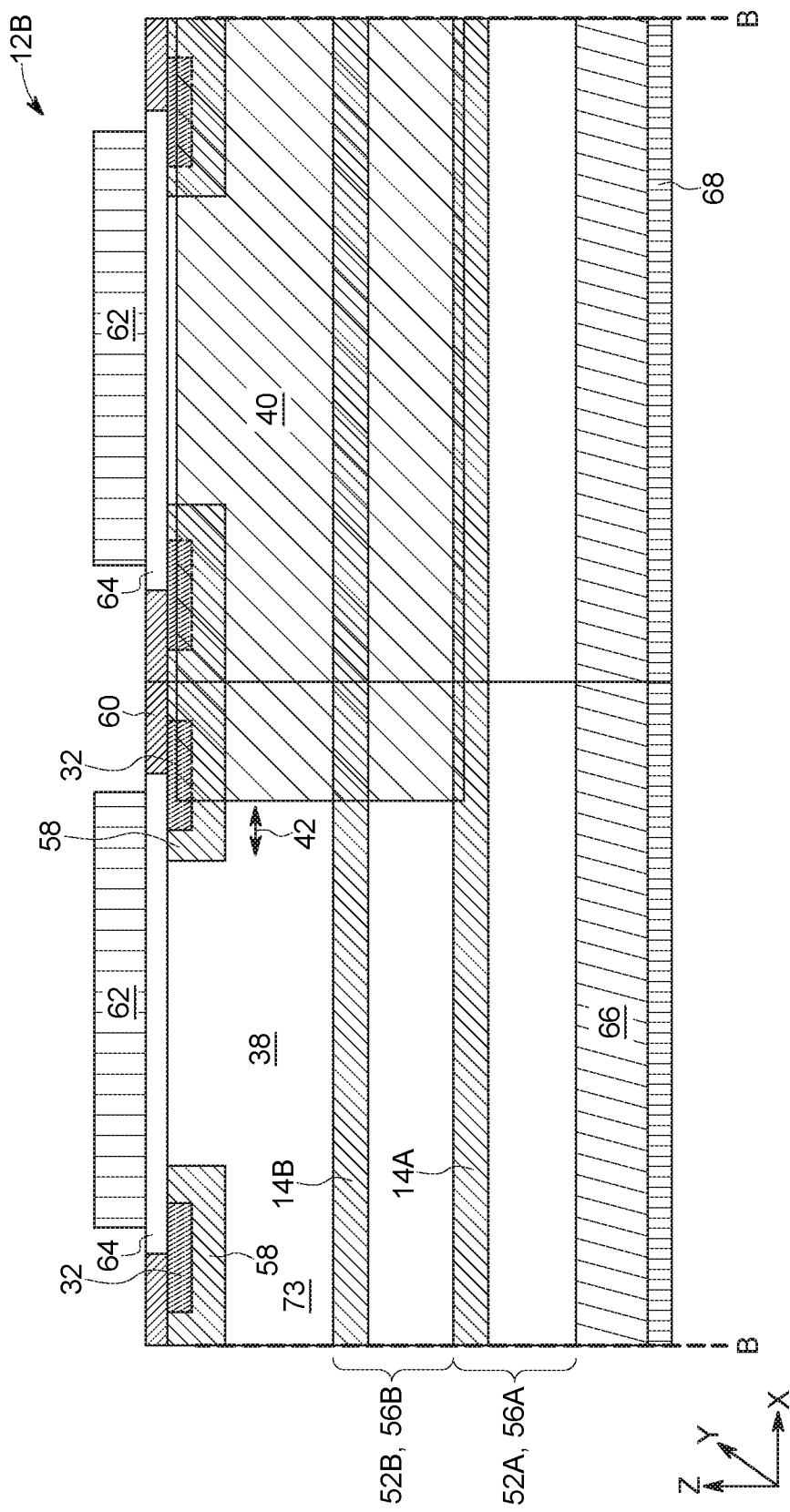
FIG. 5 is a cross-sectional view of a CB planar MOSFET device taken along line B-B of FIG. 4, in accordance with embodiments of the present approach.

FIG. 5 is a cross-sectional view of the CB planar MOSFET device 12B of FIG. 4 taken along line B-B. The arrangement further illustrates the potential placement for CB bus regions described in FIG. 4. The CB bus region 40 turns the JFET region 38 to the second conductivity type from the first conductivity type, thereby eliminating channel electron flow in the portion of JFET region 38 corresponding to the CB bus region 40 implantation region. Everywhere else, however, current continues to flow during on-state operation. For example, current still flows through the JFET region 38 that does not include the CB bus region 40. It should be understood that the CB planar MOSFET devices 12 continue to operate as described above with operational exceptions related to current flow through the JFET region 38 that includes a region of the second conductivity type. In this way, an ohmic connection is made through the source contact 60 to access the CB regions 14 (e.g., CB region 14B, CB region 14C) to be used in addition or alternative to the designs set forth herein. It should be noted that although the CB bus region 40 is shown as extending into the source region 32, the heavy doping of the source region 32 swamps (e.g., cancels out, compensates) any potential doping from the high-energy ion implantation (e.g., associated with a dopant ion concentration of approximately $1 \times 10^{19}$ per centimeters cubed ($cm^{-3}$)) based at least in part on the doping from the high-energy ion implantation being of sufficiently low dopant concentrations (e.g., associated with a dopant ion concentration of approximately $2.5 \times 10^{16}$ $cm^{-3}$) to permit the swamping, hence the dotted line depiction in FIG. 5.

Figure 6:
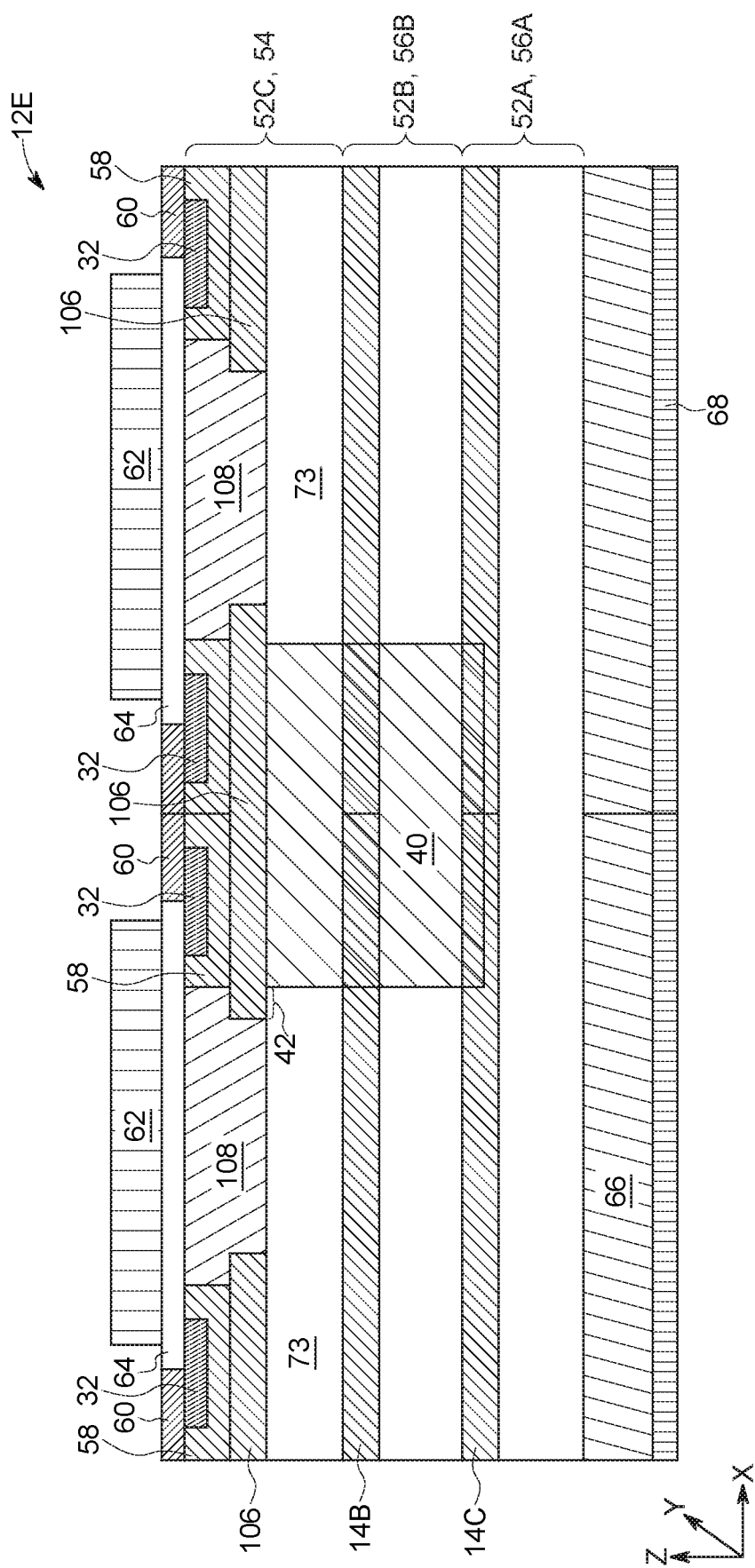
FIG. 6 is a cross-sectional view of another embodiment of the CB planar MOSFET device of FIG. 2, in accordance with embodiments of the present approach.

In yet another embodiment, FIG. 6 is a cross-sectional view of another embodiment of the CB planar MOSFET device 12 of FIG. 2, CB planar MOSFET device 12E. The CB planar MOSFET device 12E includes many of the same or substantially similar features as the previous embodiments. However, the CB planar MOSFET device 12E also includes a shield region 106 having the second conductivity type and an enhanced doping JFET region 108 having the first conductivity type. As mentioned above in the discussions of FIG. 3, the enhanced doping JFET region 108 is formed to be disposed on the drift region 73. The dopant ion concentration of the shield region 106 may be formed using an implantation dose of at least approximately $3.0 \times 10^{13}$ per square centimeters ($cm^{-2}$). Having the shield region 106 facilitates protecting the channel region 36 (e.g., as depicted at least in, for example, FIG. 2) from high electric fields present while the CB planar MOSFET device 12E is reversed biased. The shield region 106 also protects the JFET region 38 (e.g., JFET region 38 is doped to become enhanced doping JFET region 108) from the high electric fields. The CB planar MOSFET device 12E includes the enhanced doping JFET region 108 having the first conductivity type at a concentration substantially greater than the epi doping of the epi layer 52C. For example, the enhanced doping JFET region 108 may have a dopant ion concentration of approximately $5 \times 10^{16}$ $cm^{-3}$ to approximately $8 \times 10^{16}$ $cm^{-3}$ and the epi doping of the epi layer 52C may an epi dopant ion concentration of approximately $1 \times 10^{16}$ $cm^{-3}$. The enhanced doping JFET region 108 is included to aid current flow toward the drain contact 68 from the source contact 60. In this way, the enhanced doping JFET region 108 locally enhances the conductivity of the epi layer 52C around the shield region 106 (e.g., in the direction of the X-axis) aiding the transport of electrons from the drain contact 68 (e.g., vertically toward the drain contact 68 in the −Z direction relative to the Z-axis), helping to avoid channel pinch-off while the CB planar MOSFET device 12E is in the active state. Including the enhanced doping JFET region 108 lowers the previously depicted JFET region 38 resistance and facilitates protecting the oxide disposed on the JFET region 38.

The CB bus region 40 may connect to the CB regions 14 in a similar manner as described above. The CB bus region 40 contact is made through the shield region 106 to the well region 58 and the source contact 60. Similar to as described above, any suitable number of CB regions 14, CB layers 56, and/or CB bus regions 40 may be included in this particular embodiment of the CB planar MOSFET device 12E.

Figure 7:
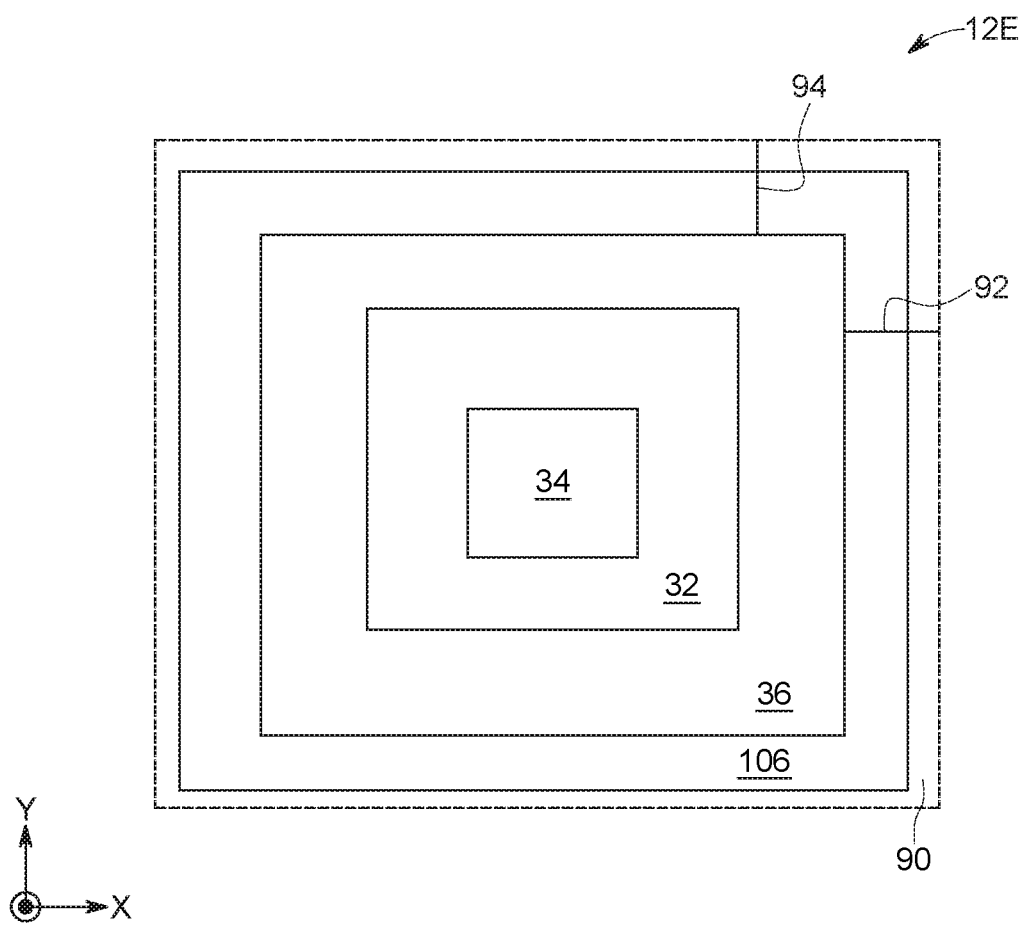
FIG. 7 is a plan view of the CB planar MOSFET device of FIG. 6, in accordance with embodiments of the present approach.

FIG. 7 is a plan view of the CB planar MOSFET device 12E embodiment depicted in FIG. 6. As depicted, the CB planar MOSFET device 12E is a square cell to be disposed following square coordinates. The device is similar to the structures described above and includes the shield region 106. In this way, the shield region 106 is formed to have an area greater than that of the source region 32, the channel region 36, and the base region 34, and thus the well region 58. However, the shield region 106 is limited to the dimensions of the cell. As a reminder, the dimensions of the cell are defined relative to the JFET region 38 (or the enhanced doping JFET region 108), such that the cell extends into the JFET region 38 the length 94 and the width 92 but not so far as to consume the whole length 93 and width 91 (e.g., shown in FIG. 4) of the JFET region 38. In this way, the shield region 106 is formed between the channel region 36 and the JFET region 38.

Figure 8:
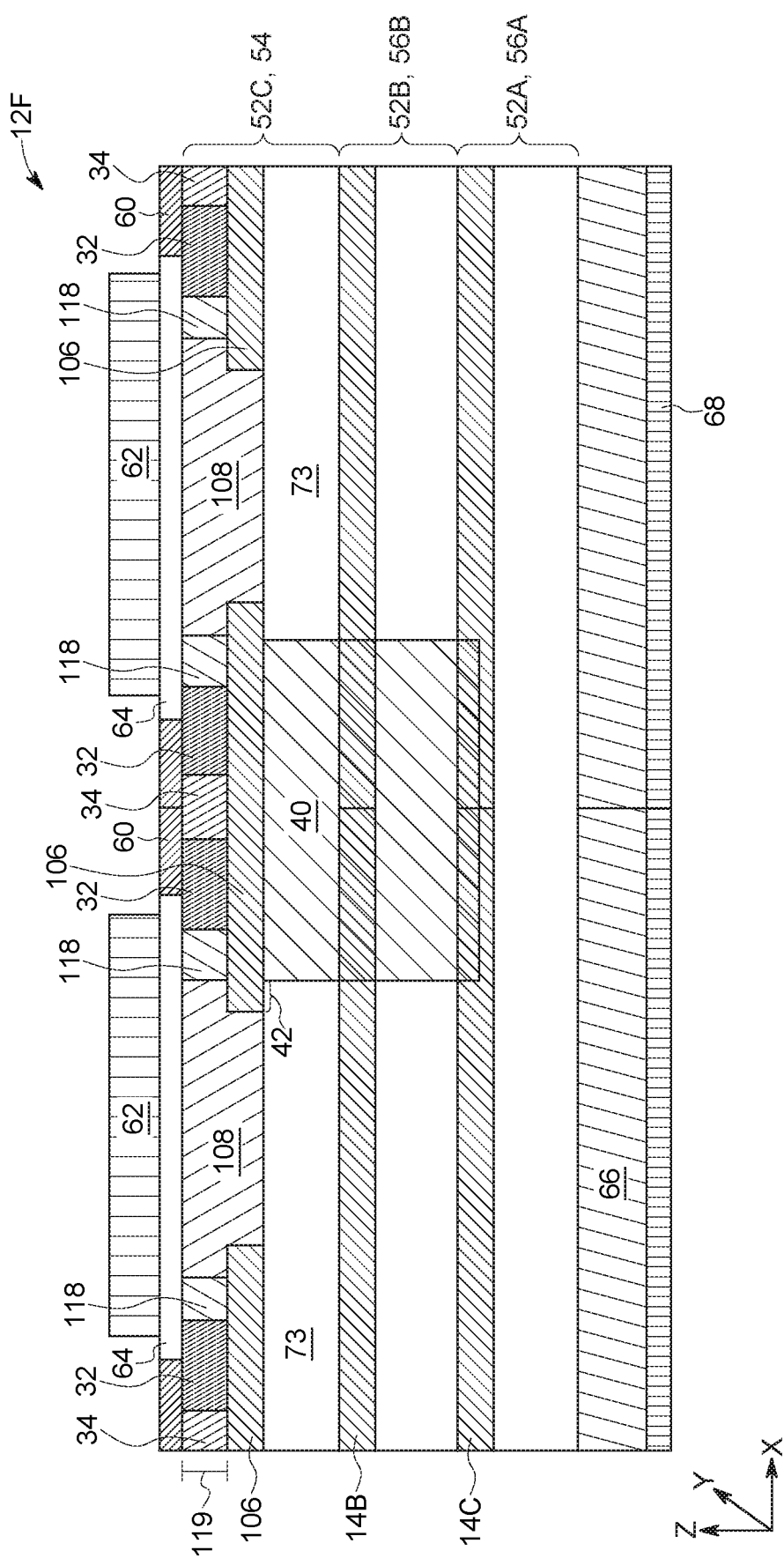
FIG. 8 is a cross-sectional view of another embodiment of the CB planar MOSFET cellular device of FIG. 2, in accordance with embodiments of the present approach.

The CB planar MOSFET devices described above operate as inversion-mode planar MOSFET semiconductor power devices. In yet another embodiment, FIG. 8 is a cross-sectional view of another embodiment of the CB planar MOSFET device 12 of FIG. 2 that operates in an accumulation mode, CB planar MOSFET device 12F. The CB planar MOSFET device 12F illustrated in FIG. 8 is considered to be a depletion field-effect transistor (FET) and includes the CB regions 14 (e.g., CB region 14B, CB region 14C) and the shield region 106. This embodiment also includes the source region 32 of the first conductivity type in addition to a base region 118 of the first conductivity type, which as a reminder opposing the conductivity type of the base region 34. The CB planar MOSFET device 12F does not, however, include the well region 58 and instead includes the source region 32 and the base region 34 formed to a depth 119. The base region 118 may be lightly doped (e.g., relative to the source region 32) and may be formed between the source region 32 of the first conductivity type and the enhanced doping JFET region 108 to create a normally-off device through zero bias depletion with the opposing doping type in the region 106. As mentioned above in the discussions of FIG. 3, the enhanced doping JFET region 108 is formed to be disposed on the drift region 73.

When the gate 62 of the CB planar MOSFET device 12F is biased with a positive voltage (e.g., positive gate voltage), an accumulation layer forms a conductive path between the source contact 60 and the drain contact 68. When the gate 62 bias is zero, the base region 118 is depleted and the CB planar MOSFET device 12F is off. The electron transport is through an accumulation mobility, which is larger than the inversion mobility of other embodiments. Through this arrangement, the contribution of the channel to the drain-source on resistance (Rds(on)) is reduced. Similar to previous embodiments, the CB bus region 40 also features an ohmic connection from the source contact 60 to CB region 14B and CB region 14C of the second conductivity type, permitting the electrical coupling back to the CB regions 14 and to the base region 34.

Figure 9:
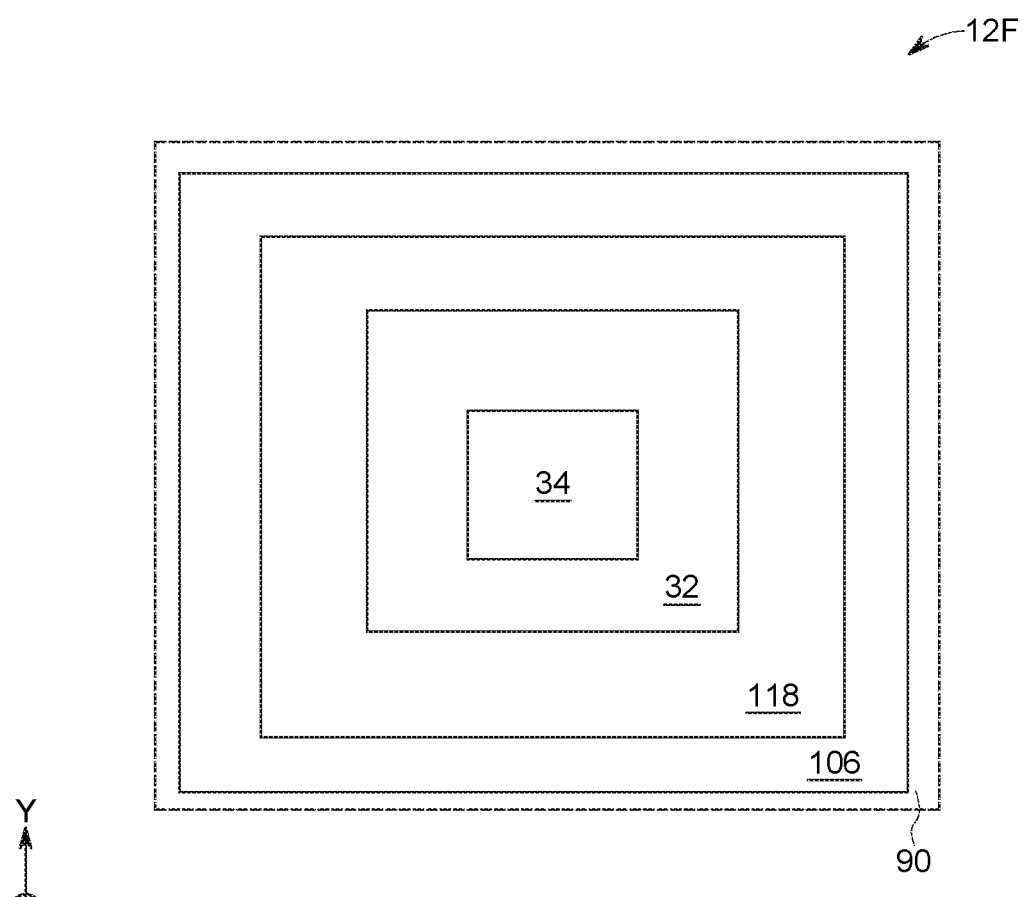
FIG. 9 is a plan view of the CB planar MOSFET device of FIG. 8, in accordance with embodiments of the present approach.

FIG. 9 is a plan view of the CB planar MOSFET device 12F embodiment depicted in FIG. 8. As depicted, the CB planar MOSFET device 12F is a square cell to be disposed following square coordinates. The device is similar to the structures that include the shield region 106 and also includes the base region 118 and the base region 34. The shield region 106 is formed to have an area greater than that of the source region 32, and the base region 34, and the base region 118. However, the shield region 106 and the base region 118 are limited to the dimensions of the cell. In this way, the shield region 106 is formed between the base region 118 and the JFET region 38 (or the enhanced doping JFET region 108), and the base region 118 is formed between the source region 32 and the shield region 106.

As described above, FIGS. 1-9 generally depict rectangular (e.g., square) cells disposed in the array 10 following rectangular coordinates (e.g., square coordinates). However, as will be appreciated, many suitable structures may use the techniques described above. For example, in one embodiment, the enhanced doping JFET region 108 may not be included with the shield region 106, or vice versa. In another embodiment, the array 10 of FIG. 1 may include square cells following square coordinates structure, circular cells following square coordinates structure, hexagonal cells following hexagonal coordinates structure, hexagonal cells following square coordinates structure, atomic lattice cells following square coordinates structure, or the like.

Figure 10:
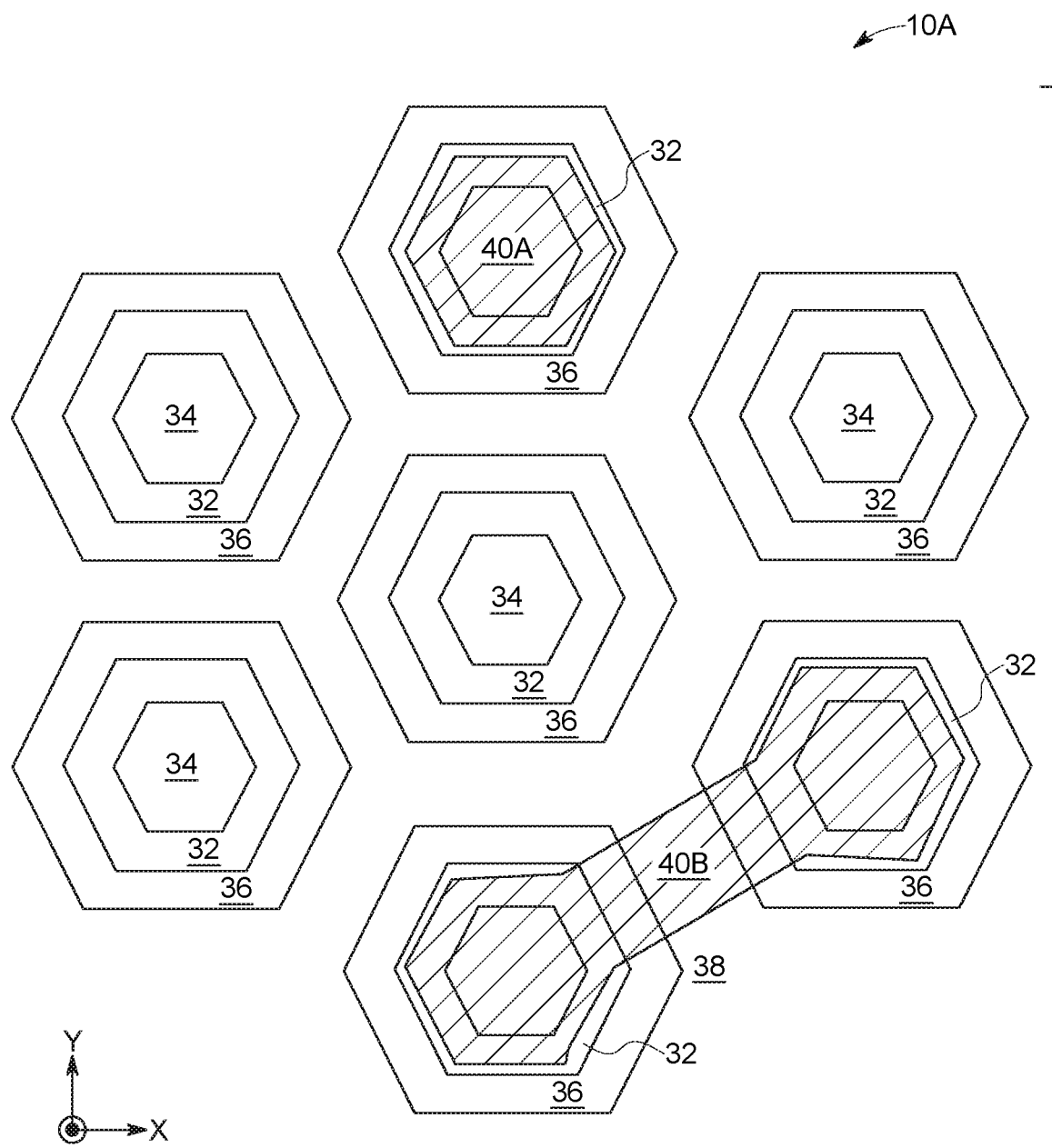
FIG. 10 is a plan view of another embodiment of the semiconductor device array of FIG. 1, in accordance with embodiments of the present approach.

With this in mind, FIG. 10 is a plan view of another embodiment of the semiconductor device array 10 of FIG. 1, array 10A. As depicted, the array 10A includes hexagonal cells following hexagonal coordinates. Although any suitable cell structure may be formed to have hexagonal cells and/or formed to follow hexagonal coordinates, for ease of discussion, cell embodiments described using FIG. 2 and FIG. 3 are described with respect to FIG. 10. The depicted hexagonal cells include the base region 34, the source region 32, and the channel region 36. The hexagonal cells also include the well region 58 having the base region 34 and the channel region 36 formed at the surface of the well region 58. Similar to the rectangular cells, the CB bus regions 40 (e.g., CB bus region 40A, CB bus region 40B) may be formed to connect the well region 58 and the CB regions 14 of the depicted devices. Thus, the CB bus regions 40 are depicted as being formed between the source region 32 and the base region 34, though it should be understood that the base region 34 and the source region 32 are disposed on the CB bus region 40. The CB bus region 40A depicts the doped region of the CB bus region 40A as included within the area of the source region 32. However, the CB bus region 40B depicts another embodiment of the CB bus regions where the doped region is defined across cells. In this way, the CB bus region 40B causes the loss of the channel region 36 corresponding to the region impacted by the CB bus region 40B. It may also be appreciated that, in certain embodiments, the hexagonal cells illustrated in FIG. 11 may afford advantages over rectangular or square-shaped cells in terms of increased periphery of the channel region 36 and/or increased density of the JFET region 38. The hexagonal cells following hexagonal coordinate also enables lower electric field near the corners of the well region 58 and also in the oxide 64 above the center of JFET region 38.

Technical effects of the invention include designs and methods of manufacturing CB planar MOSFET devices that reduce the resistance and increase switching speed of the CB planar MOSFET devices while maintaining the high blocking voltage of the CB planar MOSFET devices. In particular, the disclosed CB planar MOSFET devices include a CB bus region that electrically couples one or more CB regions of a CB planar MOSFET device to a region having the same conductivity type as the one or more CB regions, such as at least a portion of a well region or a shield region. The CB bus region may be implanted using high-energy ion implantation. Accordingly, the resulting CB planar MOSFET device may have increased switching speeds and reduced switching losses while maintaining high blocking voltages.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A charge balanced (CB) planar metal-oxide-semiconductor (MOS) device, comprising:
   a charge balanced (CB) layer defined within a first epitaxial (epi) layer and comprising a first conductivity type, wherein the CB layer includes a plurality of charge balanced (CB) regions of a second conductivity type;
   a device layer defined in a second epi layer disposed on the CB layer, wherein the second epi layer comprises the first conductivity type and wherein the device layer includes a plurality of non-linear device cells that each comprise:
      a first base region of the second conductivity type disposed at an upper surface of the second epi layer;
      a source region of the first conductivity type disposed at the upper surface of the second epi layer adjacent to the first base region;
      a second base region of the first conductivity type disposed in the second epi layer adjacent to the source region;
      a shield region of the second conductivity type disposed below the source region; and
      a junction field-effect transistor (JFET) region of the first conductivity type disposed at the upper surface of the second epi layer adjacent to a channel region or the second base region;
   a source contact disposed directly on the source region and the first base region in the second epi layer; and
   a charge balanced (CB) bus region of the second conductivity type that extends between at least one of the plurality of CB regions of the CB layer and the shield region and electrically couples the at least one of the plurality of CB regions of the CB layer to the source contact via the shield region of at least one of the plurality of non-linear device cells.

2. The CB planar MOS device of claim 1, wherein the CB bus region extends between and electrically couples a first region of a first device cell of the plurality of non-linear device cells, a second region of a second device cell of the plurality of non-linear device cells, and the at least one of the plurality of CB regions, wherein the first and second regions are of the second conductivity type.

3. The CB planar MOS device of claim 1, wherein the CB bus region electrically couples to the plurality of CB regions through an ohmic contact from the source contact.

4. The CB planar MOS device of claim 1, wherein the CB bus region comprises a first implantation region coupled to a second implantation region through the at least one of the plurality of CB regions.

5. The CB planar MOS device of claim 1, wherein the shield region is disposed below the second base region adjacent to the source region.

6. The CB planar MOS device of claim 1, wherein the JFET region comprises doping different from doping of the first epi layer and is adjacent to the second base region.

7. The CB planar MOS device of claim 1, wherein the first conductivity type is created from p-type dopants.

8. The CB planar MOS device of claim 1, wherein the plurality of non-linear device cells are hexagonal cells configured to form a hexagonal coordinates structure.

9. The CB planar MOS device of claim 1, wherein the plurality of non-linear device cells are rectangular cells configured to form a rectangular coordinates structure.

10. The CB planar MOS device of claim 1, wherein at least a portion of the JFET region separates a first non-linear device cell from a second non-linear device cell such that the first non-linear device cell and the second non-linear device cell are configured to align within a cellular device structure.

11. A system, comprising:
   a first charge balanced (CB) planar metal-oxide-semiconductor (MOS) device and a second CB planar MOS device, wherein in the first CB planar MOS device and the second CB planar MOS device each respectively comprise:
      a first epitaxial (epi) layer comprising one of a base region of a first conductivity type or a channel region of a second conductivity type;
      a junction field-effect transistor (JFET) region of the first conductivity type disposed at an upper surface of the first epi layer adjacent to the channel region or the base region;

a charge balanced (CB) layer defined within a second epitaxial (epi) layer comprising the first conductivity type, wherein the CB layer includes a plurality of charge balanced (CB) regions of the second conductivity type; and a source contact disposed on a device layer defined in the first epi layer, wherein the first epi layer is disposed on the CB layer;

an active area comprising the first CB planar MOS device and the second CB planar MOS device;

an overhead area of the second conductivity type disposed adjacent to the active area; and a charge balanced (CB) bus region of the second conductivity type that extends between the first epi layer and the second epi layer and electrically couples the plurality of CB regions of the CB layer to the source contact via a region of the device layer of the second conductivity type, wherein the CB bus region is disposed within the active area, the overhead area, or a combination thereof, and wherein at least a portion of the JFET region separates the first CB planar MOS device from the second CB planar MOS device such that the first CB planar MOS device and the second CB planar MOS device are configured to align within a cellular device structure.

12. The system of claim 11, wherein the CB bus region, the channel region, and a shield region disposed below the channel region have an ohmic connection to the source contact.

13. The system of claim 11, wherein the second conductivity type is created from an implantation using p-type dopants.

14. The system of claim 11, wherein the cellular device structure is configured as square cells following square coordinates structure, circular cells following square coordinates structure, hexagonal cells following hexagonal coordinates structure, hexagonal cells following square coordinates structure, atomic lattice cells following square coordinates structure, or any combination thereof.

* * * * *